United States Patent
Gorti et al.

(10) Patent No.: US 9,436,567 B2
(45) Date of Patent: Sep. 6, 2016

(54) MEMORY BIT MBIST ARCHITECTURE FOR PARALLEL MASTER AND SLAVE EXECUTION

(71) Applicant: Advanced Micro Devices, Inc., Sunnyvale, CA (US)

(72) Inventors: Atchyuth K Gorti, Austin, TX (US); Archana Somachudan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 622 days.

(21) Appl. No.: 13/718,944

(22) Filed: Dec. 18, 2012

(65) Prior Publication Data

US 2014/0173345 A1    Jun. 19, 2014

(51) Int. Cl.
  *G06F 11/00* (2006.01)
  *G06F 11/27* (2006.01)
  *G11C 29/16* (2006.01)

(52) U.S. Cl.
  CPC ............. *G06F 11/27* (2013.01); *G11C 29/16* (2013.01)

(58) Field of Classification Search
  CPC ............. G11C 29/32; G01R 31/3187; G01R 31/31724; G01R 31/318505; G01R 31/318513; G01R 31/318555; G06F 11/221; G06F 11/27

USPC .................................................... 714/30, 42
  See application file for complete search history.

(56) References Cited

U.S. PATENT DOCUMENTS

| | | | |
|---|---|---|---|
| 5,640,509 A * | 6/1997 | Balmer ................ | G11C 29/50 365/201 |
| 6,959,256 B2 * | 10/2005 | Basto ............................ | 702/117 |
| 7,434,131 B2 * | 10/2008 | Mukherjee et al. .......... | 714/733 |
| 7,844,867 B1 * | 11/2010 | Reddy et al. ................. | 714/718 |
| 8,208,326 B1 * | 6/2012 | Solt et al. ..................... | 365/201 |
| 8,423,846 B2 * | 4/2013 | Chen et al. .................. | 714/733 |
| 8,935,586 B2 * | 1/2015 | Chickanosky et al. ....... | 714/733 |
| 2006/0218452 A1 * | 9/2006 | Njinda et al. ................ | 714/718 |
| 2010/0096629 A1 * | 4/2010 | Chen .............................. | 257/48 |
| 2012/0072788 A1 * | 3/2012 | Chen et al. ................... | 714/718 |

* cited by examiner

Primary Examiner — Elmira Mehrmanesh

(57) ABSTRACT

A scalable, reconfigurable Memory Built-In Self-Test (MBIST) architecture for a semiconductor device, such as a multiprocessor, having a Master and one or more Slave MBIST controllers is described. The MBIST architecture includes a plurality of MBISTDP interfaces connected in a ring with the Master MBIST controller. Each MBISTDP interface connects to at least one Slave controller for forwarding test information streamed to it from the Master MBIST controller over the ring. Test information includes test data, address, and MBIST test commands. Each MBISTDP interface forwards the information to the Slave controller attached thereto and to the next MBISTDP interface on the ring. Test result data is sent back to the Master MBIST controller from the MBISTDP interfaces over the ring.

18 Claims, 3 Drawing Sheets

MEMORY BIT MBIST ARCHITECTURE FOR PARALLEL MASTER AND SLAVE EXECUTION

BACKGROUND

1. Field

Generally, the present disclosure relates to Memory Built-In Self-Test (MBIST) for semiconductor devices, and, more specifically, to a MBIST architecture for testing on-board cache and other memory arrays in, e.g., a multicore processor.

2. Description of the Related Art

Modern day microprocessors come with many different types of on-chip memory. Examples include cache, tag, least recently used (LRU), and various types of queues, such as centralized run, data, and core request queues (CRQ). Other semiconductor devices have other memory needs. As the size of semiconductor structures continues to shrink, more and greater-sized memory arrays can be placed on a single chip. More memory arrays means more Memory Built-In Self-Test (MBIST) testing, longer power-up times to allow for memory testing to complete, and greater power draw.

Power draw is an important consideration when designing portable, battery-powered devices like smart phones, tablet PCs, personal digital assistants (PDAs), pocket computers, and music players. These devices typically include one or more microprocessors that undergo MBIST testing upon power-up or during a wake-up cycle. When testing multiple memory arrays simultaneously (i.e., in parallel) more transistors are cycled at once than when the memory arrays are tested in serial. Testing each memory array in serial reduces overall power draw.

Testing each memory array in serial, however, increases the amount of time it takes for a device to complete power-up self-tests or recover from a sleep state. Furthermore, devices having more or larger sized memory arrays take more time to test than devices having fewer or smaller-sized memory arrays. Longer power-up or wake-up time is undesirable unless there is some benefit that can be obtained, like conserving battery life.

Scalability is also a consideration. Structures that perform MBIST testing are typically designed to the particular memories they test. Adding additional or different types of memory to a microprocessor, e.g., or resizing existing arrays usually means adding more logic to control testing.

Timing constraints also impose restrictions. Built-In Self-Test (BIST) timing typically requires memory test circuits to be placed in proximity to BIST controllers. Devices having a greater number of memory arrays spread over the same size (or wider) chip area may run into timing problems and additional routing complexities.

SUMMARY OF EMBODIMENTS

The MBIST architecture of the present invention provides many benefits. In some embodiments, the architecture is arranged in a master/slave relationship where a Master MBIST controller is connected to a plurality MBIST Slave controllers through two or more MBIST Data Path (MBISTDP) Interfaces (I/Fs). The MBISTDP I/Fs are connected in a ring with the Master controller. The Master controller streams generic address, data, control, and test commands to the first MBISTDP I/F in the ring. The MBISTDP I/F forwards one copy of the information to an attached Slave controller for MBIST testing and a second copy to the next MBISTDP I/F in the ring. Each MBISTDP I/F in the ring is attached to at least one Slave controller. The last MBISTDP I/F in the ring connects back to the Master MBIST controller.

In some embodiments, each Slave controller controls testing of at least one memory array, such as an L2 cache. When testing is complete, each Slave controller returns test result data back to the MBISTDP I/F, which forwards the test data on to the next MBISTDP I/F in the ring for delivery to the Master controller. Each MBISTDP I/F receives test result data from the previous MBISTDP I/F, concatenates it with the test result data received from the attached Slave controllers, and forwards the concatenated data to the next MBISTDP I/F in the ring. The last MBISTDP I/F in the ring forwards all test result data back to the Master BIST controller.

In some embodiments, each Slave controller operates independently of each other. In some embodiments, each slave controller operates in parallel with the other slave controllers so that testing of the memory arrays are performed concurrently. In some embodiments, each slave controller operates in serial with the others so that testing of the memory arrays are performed in serial. The Master MBIST controller designates the order of testing based on a MacroID generated and sent to the Slave controllers over the ring. The configurability of the testing allows for trade-offs between lower power draw and faster power-on, self-test speeds, depending on factors such as current battery life.

In some embodiments, a single L2 cache (e.g., a 2 MB L2 cache) is divided into a plurality of segments (e.g., four 512 KB segments) where each segment connects to one Slave controller for MBIST testing. The Master MBIST controller then (1) commands each Slave controller to test each segment at the same time (e.g., concurrently or in parallel), thereby reducing test time by a factor of N, where N is the number of segments, or (2) commands each Slave controller to test each respective memory region in serial to conserve power.

In some embodiments, each Slave controller and MBISTDP I/F is modular. Adding additional memory arrays to a chip means inserting an additional MBISTDP I/F into the ring and connecting it to a Slave controller. This configuration reduces routing complexities by, e.g., eliminating star configurations with the Master controller, and makes more efficient use of existing buses and protocols.

In some embodiments, a handshake protocol eliminates timing constraints associated with, e.g., the timing between clock, data, and control signals that are frequently fanned out from a common test, control, and clocking circuit or circuits to the various memory arrays being tested. These signals often must transition in precise sequence relative to one another. In the instant embodiments, the Master controller issues commands for testing to one or more of the Slave controllers over the ring. Each Slave controller receives the commands then conducts the requested test of the memory arrays, or other circuitry under test, attached thereto then signals the Master Controller when testing is complete. In one embodiment, each Slave controller transmits a BIST_Resume signal back to the Master controller over the ring or over separate control lines to the Master controller to alert the Master controller when testing is complete so the Master controller may continue to the next test. Each Slave controller may also transmit test result data back to the Master controller over the ring for processing.

In some embodiments, an apparatus comprising a master controller, two or more slave controllers, and two or more MBISTDP interfaces connected in a ring with the master controller is provided. Each slave controller connects to one of the two or more MBISTDP I/Fs and tests a different memory array or a different portion of the same memory array.

In some embodiments, the master controller is configured to control testing of the memory arrays in a manner that conserves battery power or reduces power-on or wake-up self-test time.

In some embodiments, at least one slave controller connects to at least two different memory arrays, the memory arrays being selected from the list comprising a data cache, LRU, CRQ, tag cache, or other type of memory array.

One method in accordance with some embodiments includes forming a master MBIST controller, a plurality of MBISTDP I/Fs, and a plurality of slave controllers in a semiconductor material, connecting the master controller and MBISTDP I/Fs in a ring, and connecting each of the plurality of slave controllers to a memory array or a different portion of the same memory array for built-in self-testing.

In another method in accordance with some embodiments includes sending address and test data to a plurality of MBISTDP I/Fs from a master controller, wherein the master controller and the MBISTDP I/Fs are connected in a ring, forwarding the address and test data to at least one slave controller from at least one MBISTDP I/F, conducting a MBIST test on a memory array attached to the at least one slave controller, and returning test result data from the slave controller to the master controller.

In other embodiments, the apparatuses described above may be designed using a hardware descriptive language and stored on a computer readable storage device encoded with data that, when implemented in a manufacturing facility, adapts the manufacturing facility to create the apparatuses. Though described in the context of a microprocessor design, the invention may be used in any type of integrated circuit and is not limited to a microprocessor design.

As one of ordinary skill in the art understands, the architecture, principals, and techniques described herein can be varied, mixed, and matched, and are not limited to the specific embodiments disclosed. Rather, the subject matter as a whole is illustrated by way of the disclosed embodiments.

BRIEF DESCRIPTION OF THE FIGURES

The disclosed subject matter will hereafter be described with reference to the accompanying drawings, wherein like reference numerals denote like elements, and.

Figure 1:
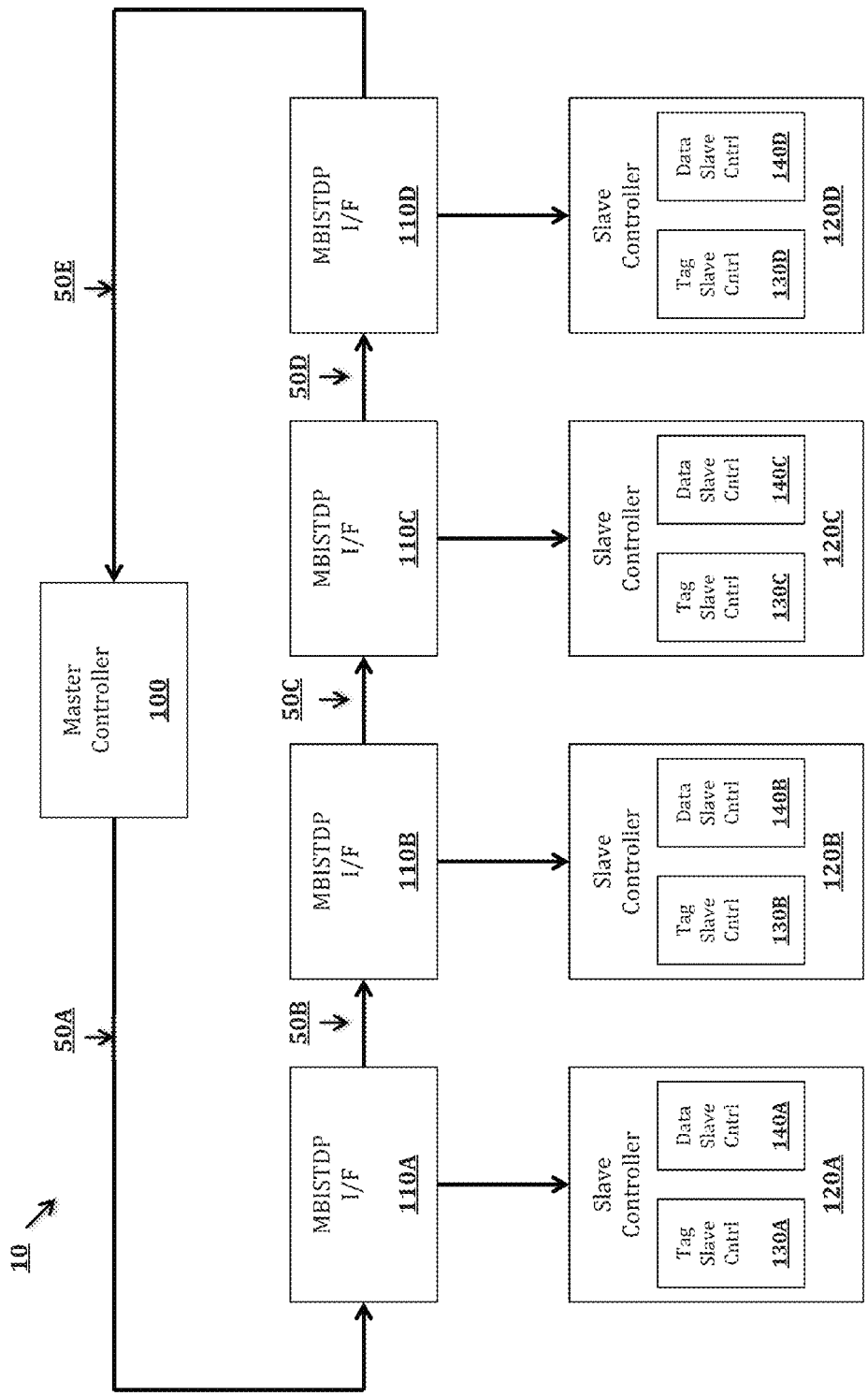
FIG. 1 is a block diagram of a Memory Built-In Self-Test (MBIST) architecture in accordance with some embodiments.

While the disclosed subject matter is susceptible to various modifications and alternative forms, specific embodiments thereof have been shown by way of example in the drawings and are described in detail herein. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

FIG. 1 is a block diagram of a Memory Built-In Self-Test (MBIST) architecture 10 in accordance with an example embodiment. A Master controller 100 connects to four MBIST Data Path (MBISTDP) Interfaces (I/Fs) 110A-D to form ring 50A-E. Master controller 100 generates generic address and test data and commands and/or control data and transmits them to MBISTDP I/F 110A over ring portion 50A. MBISTDP I/F 110A receives the data and forwards one copy of it to Slave controller 120A and another copy to the next MBISTDP I/F in the ring, specifically MBISTDP I/F 110B. Each successive MBISTDP I/F 110B-D performs the same operation. Each receives the address, test, commands, and/or control data generated by Master controller 100 from the previous MBISTDP I/F in the ring and forwards one copy of the data to its attached, respective Slave controller 120B-D and another copy to the next MBISTDP I/F in the ring.

Figure 2:
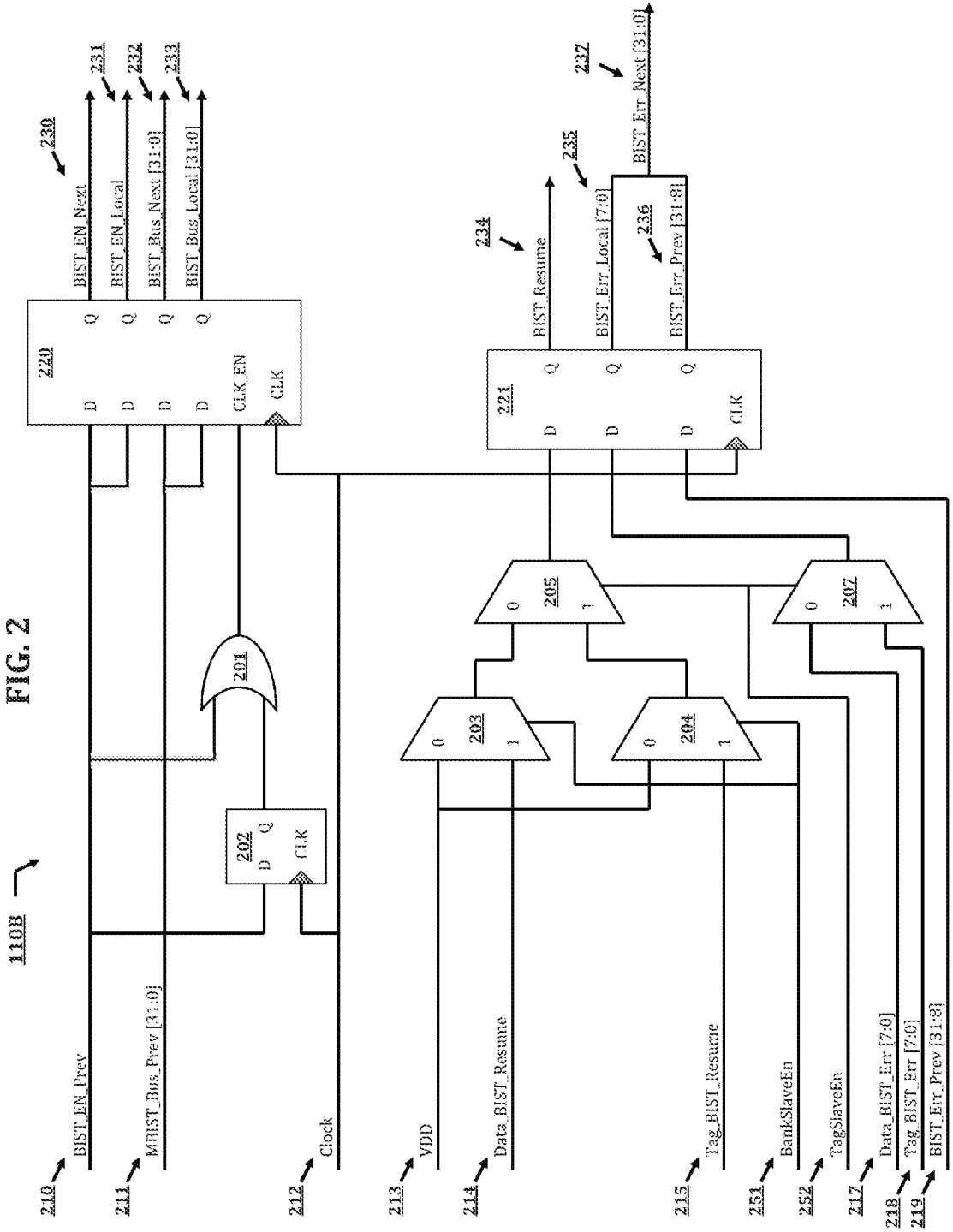
FIG. 2 is a block diagram of MBIST Data Path Interface (MBISTDP I/F) 110B of FIG. 1 in accordance with some embodiments.

FIG. 2 is a block diagram of MBISTDP I/F 110B of FIG. 1 in accordance with an example embodiment. Master controller 100 (FIG. 1) generates a BIST_EN signal (not shown) and address, test, and command data and transmits them over ring portion 50A to MBISTDP I/F 110A. The address, test, and command data is transmitted over a bus called MBIST_Bus [31:0] (not shown), which is part of ring 50A. These signals pass through MBISTDP I/F 110A before reaching MBISTDP I/F 110B, and reach MBISTDP I/F 110B as BIST_EN_Prev 210 and MBIST_Bus_Prev [31:0] 211. MBISTDP I/F 110B clocks BIST_EN_Prev 210 and MBIST_Bus_Prev [31:0] 211 into Flop 220. A copy of BIST_EN_Prev 210 and MBIST_Bus_Prev [31:0] 211 is forwarded to the next MBISTDP I/F in the ring as BIST_EN_Next 230 and MBIST_Bus_Next [31:0] 232. Each MBISTDP I/F 110A-D is identical to the others.

By clocking each of BIST_EN_Prev 210 and MBIST_Bus_Prev [31:0] 211 into two inputs of Flop 220, MBISTDP I/F 110B creates a second copy of BIST_EN_Prev 210 and MBIST_Bus_Prev [31:0] 211 and passes the second copy to Slave controller 120B as BIST_EN_Local 231 and MBIST_Bus_Local [31:0] 233, respectively. In this manner, each Slave controller 120A-D receives a copy of BIST_EN and MBIST_Bus [31:0] generated by Master controller 100.

In some embodiments, a separate control bus could be used to pass control and test commands and can be referred to as MBIST_Control_Bus [8:0], for example. One of ordinary skill in the art would understand that the control bus or any control or data signal could be distributed to each Slave controller 120A-D in the manner that MBIST_Bus [31:0] and BIST_EN are distributed.

Figure 3:
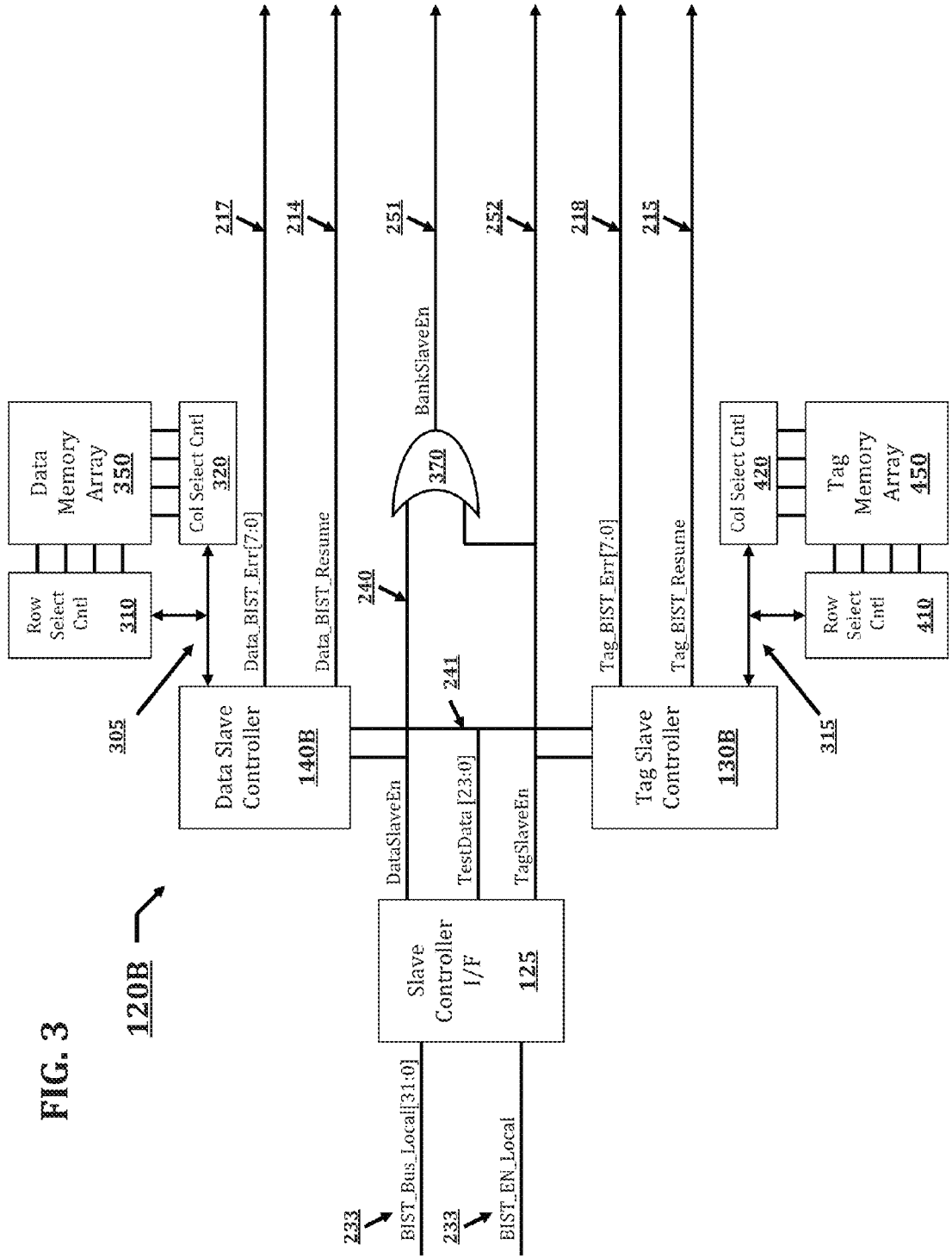
FIG. 3 is a block diagram of Slave Controller 120B of FIG. 1 in accordance with some embodiments.

FIG. 3 is a block diagram of Slave Controller 120B of FIG. 1 in accordance with an example embodiment. As discussed above, each Slave controller 120A-D receives MBIST_Bus [31:0] and BIST_EN as MBIST_Bus_Local [31:0] 233 and BIST_EN_Local 231, respectively. Once received, Slave controller 120B decodes the information on MBIST_Bus_Local [31:0]. In some embodiments, the most significant eight bits of the MBIST_Bus may indicate the type of data being sent, such as test data or a command, and the other bits may contain the test or the command itself. If a separate control bus is used, the control bus could identify the type of data being sent by Master controller 100 over the MBIST_Bus [31:0]. Other protocols for communicating the type of data to each Slave controller 120 can be used and are not limited to the described embodiments. The BIST_EN signal identifies when valid commands or data are present on MBIST_Bus. In some embodiments, a separate MBIST_Bus Data Valid signal could be used and passed to each Slave controller 120A-D in the same manner as BIST_EN.

As part of the test data, Master controller 100 generates a MacroID which is sent over MBIST_Bus [31:0]. Each Slave controller 120A-D decodes the MacroID to determine whether a test is to be run by that Slave controller and which memory array is to be tested. Tables 1 and 2 provide example bit definitions for the MacroID.

TABLE 1

| MacroID [8:5] | Controller ID |
|---|---|
| 0000 | Slave Controller 120A Test |
| 0001 | Slave Controller 120B Test |
| 0010 | Slave Controller 120C Test |
| 0011 | Slave Controller 120D Test |
| 1000 | All Slave Controllers (in parallel) |

TABLE 2

| MacroID [4:2] | Memory to be Tested |
|---|---|
| 0xx | Tag Array |
| 100 | Least Recently Used (LRU) Array |
| 101 | Centralized Run Queue (CRQ) |
| 110 | Data Array |

Each Slave controller 120A-D may conduct MBIST testing in parallel or in serial with the other controllers. For example, a MacroID of '1000 0xx' instructs all Slave controllers to conduct the next test on their respective Tag Array, whereas a MacroID of '0001 100' instructs Slave controller 120B alone to conduct the next test on its respective LRU array. If a particular Slave controller is not enabled, it ignores the next command sequence streamed from the Master controller 100.

Referring back to FIG. 3, Slave controller interface 125 receives MBIST_Bus_Local [31:0] and BIST_EN_Local from MBISTDP I/F 110B and decodes the commands, addresses, controls and/or test data, including the MacroID. In the embodiment shown, Slave controller 120B comprises a Data Memory Array 350 and a Tag Memory Array 450, though other types of memory arrays exist, such as CRQs and LRUs, and can replace the Data and Tag Memory arrays in other configurations. If, e.g., Master controller 100 requests that Data Memory Array 350 be tested, Slave controller interface 125 sources an enable signal DataSlaveEn 240 to Data Slave controller 140B. Slave controller interface 125 then receives test pattern data and address data over MBIST_Bus_Local [31:0] 233 (the address data locates where the test pattern data is to be stored within the memory array) and forwards the data over TestData bus 241 to Data Slave Controller 140B. Alternatively, Data Slave Controller 140B can be attached directly to MBIST_Bus_Local [31:0], receive MBIST_Bus [31:0] data directly, decode the MacroID and the test, control and data itself, and source its own DataSlaveEn 240 signal. Alternatively, Data slave controller 140B, Tag slave controller 130B, and Slave controller I/F 125 may each receive MBIST_Bus_Local [31:0] 233. In this embodiment, Slave controller I/F 125 uses MBIST_Bus_Local [31:0] 233 to decode the MacroID and to source DataSlaveEn 240 or TagSlaveEn 252, and Data slave controller 140B and Tag slave controller 130B receive address, control, and test pattern data over MBIST_Bus_Local [31:0] 233.

Each Data slave controller 140B and Tag slave controller 130B is configured to test the particular memory or memories attached thereto. For example, the Data memory array 350 and Tag Memory Arrays 450 may both be SRAMs or DRAMs. If both are SRAMs, then one may be configured differently than the other. For example, the storage cells in Data Memory Array 350 may be configured with more columns than rows while the storage cells in Tag Memory Array 450 may be configured with more rows than columns. These differences may exist across Slave controllers 120A-D, as well. For example, the Data Memory Array 350 of one Slave controller may have a different number of rows and columns than the Data Memory Array 350 of another.

The respective Data 140 and Tag Slave controllers 130 are configured with the specific topologies of the memories each tests. When Master controller 100 generates generic address and test data, each respective slave controller translates the data into the physical addresses needed to test the particular memory's topology. In other words, if a checkerboard pattern is written into each memory array to test, e.g., the leakage between adjacent cells, the respective slave controllers may need to translate the generic logical addresses generated by the Master controller 100 into the physical addresses needed to store the 1's and 0's into the physically adjacent storage locations. Specifically, each Data 140 and Tag Slave controller 130 takes the generic test information transmitted from the Master controller 100 and customizes it for testing the particular memory array so that the test can be sufficiently carried out. The Master controller 100 does not need to know the topology of each memory array, and each memory array may be different from the others.

Each Data slave controller 140B and Tag Slave Controller 130B conducts the MBIST test by reading and writing test data to the prescribed locations within the memories and compiles test result data. The test result data is sent back to MBISTDP I/F 110B on Data_BIST_Err [7:0] 217 or Tag_BIST_Err [7:0] 218 bus, respectively, depending on which memory array was tested. Test result data may include error codes that indicate that no error was encountered during testing, that an un-repairable error was encountered, or any other type of information.

Referring back to FIG. 2, MBISTDP I/F 110B receives Data_BIST_Err [7:0] 217 and Tag_BIST_Err [7:0] 218 on Mux 207. Mux 207 selects which error bus to return to Master controller 100 by the state of TagSlaveEn 252. If TagSlaveEn 252 is high, the Tag_BIST_Err [7:0] bus 218 is clocked into Flop 221 and returned to the Master controller 100 as BIST_Err Local [7:0] 235. If TagSlaveEn 252 is low, Data_BIST_Err [7:0] 217 is clocked into Flop 221 and returned as BIST_Err Local [7:0] 235. As indicated, MBISTDP I/F 110B concatenates BIST_Err Local [7:0] 235 with BIST_Err_Prev [31:8] 219 received from the previous MBISTDP I/F and forwards the concatenated information on to the next MBISTDP I/F for eventual delivery to the Master controller 100 over the ring as BIST_Err_Prev [31:0]. Each of the four MBISTDP I/Fs 110A-D sources 8 bits of the 32 bit BIST_Err_Prev [31:0] bus returned to the Master controller 100.

Referring back to FIG. 3, Slave Controller I/F 125 generates TagSlaveEn 252 and DataSlaveEn 240 from the MacroID. When bits [4:2] of MacroID indicate that tag memory is to be tested, Slave Controller I/F 125 activates TagSlaveEn 252. When bits [4:2] of MacroID indicate that data memory array 350 is to be tested, Slave Controller I/F 125 activates DataSlaveEn 252. If a Slave controller 120 contains another type of memory, a similar set of control signals is generated and BIST_Err [7:0] data corresponding to that memory is returned to Master controller 100 via MBISTDP I/F 110. If Master controller 100 requested Slave controller 120B to perform a test, Slave Controller interface 125 would source the appropriate control signal, DataSlaveEn 252 or TagSlaveEn 252, and BankSlaveEn 251 would be sourced high via OR-gate 370 to indicate that Slave controller 120B had been selected.

Referring now to FIG. 2 and FIG. 3, Data Slave controller 140B and Tag Slave controller 130B each source a BIST_Resume signal, Data_BIST_Resume 214 and Tag_BIST_Resume 215, respectively. The BIST_Resume signal is a handshake signal that is returned to the Master controller 100 from each Slave controller 120 to signal to the Master controller 100 that testing of the specific memory array is complete. BankSlaveEn 251, attached to Multiplexers 203 and 204 (FIG. 2), forwards the two BIST_Resume signals to Multiplexer 205. The state of TagSlaveEn 252 then selects which of the two BIST_Resume signals, Data_BIST_Resume 214 or Tag_BIST_Resume 215, is presented to Flop 221. The selected BIST_Resume signal is then returned to the Master controller 100 as BIST_Resume 234.

In some embodiments, each BIST_Resume 234 is returned directly to the Master controller 100 rather than forwarded on to the next MBISTDP I/F 110 in the ring. In some embodiments, the BIST_Resume 234 leaving one MBISTDP I/F 110B can be logically ANDed with the BIST_Resume 234 signal from the previous MBISTDP I/F, such as MBISTDP I/F 110A, and transmitted back to the Master controller 100 via ring 50B-E. In this arrangement, the BIST_Resume 234 signal leaving MBISTDP I/F 110D would be sourced high only when all previous BIST_Resume 234 signals are high, indicating that all Slave controllers have completed their respective tests and are ready to receive the next instruction from Master controller 100.

When a particular Slave controller is not selected for test, the respective BankSlaveEn 251 signal remains a logic low. This selects VDD as the output of Multiplexers 203 and 204 which becomes BIST_Resume 234, thereby indicating that it is ready to resume testing.

While the described embodiments disclose one or more Slave controllers 120A-D comprising a Data Slave controller 140B and a Tag Slave controller 130B, other arrangements exist. For example, other types of memories, such as L2 cache, least recently used (LRU) cache, and various types of queues, such as centralized run, data, and core request queues (CRQ), are frequently found in microprocessors. Each type of memory would have a correspondingly named slave controller for testing, such as a CRQ slave controller. The CRQ slave controller may be identical to slave controllers 140A-D and 130A-D discussed herein and function identically if, e.g., they test identically configured memory arrays. The names of the controllers only indicate that type of data stored the array and not necessarily the configuration of the array. Furthermore, the number of slave controllers 120 and master controllers MBISTDP I/F controllers 110 are not limited to the number illustrated in FIG. 1.

Multicore processors and other devices having the MBIST architecture described herein may be formed on a semiconductor material by any known means in the art. Forming can be done, for example, by growing or deposition, or by any other means known in the art. Different kinds of hardware descriptive languages (HDL) may be used in the process of designing and manufacturing such microcircuit devices. Examples include VHDL and Verilog/Verilog-XL. In some embodiments, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in one embodiment, may be used to configure a manufacturing facility (e.g., through the use of mask works) to create devices capable of embodying various aspects of the disclosed embodiments. As understood by one or ordinary skill in the art, it may be programmed into a computer, processor or controller, which may then control, in whole or part, the operation of a semiconductor manufacturing facility (or fab) to create semiconductor products and devices. These tools may be used to construct the embodiments described herein.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

What is claimed:
1. An apparatus having a built-in self-test (BIST) architecture comprising:
 a master controller for controlling built-in self-testing of a device;
 three or more BIST Data Path (BISTDP) interfaces (I/Fs) connected in a ring to the master controller;
 two or more slave controllers, each connected to a BISTDP I/F for receiving test commands from the master controller and for conducting built-in self-testing, each slave controller configured to test at least a portion of a circuit and provide test result data to the corresponding BISTDP I/F; and
 wherein each of a subset of the three or more BISTDP I/Fs is to concatenate test result data received from a previous BISTDP I/F in the ring with test result data received from the corresponding slave controller and forward the concatenated test result data to a next BISTDP I/F in the ring.

2. The apparatus of claim 1, wherein the built-in self-test tests at least one memory array, and wherein the at least a portion of the circuit includes at least a portion of the at least one memory array.

3. The apparatus of claim 1, wherein the master controller is configured to control testing to conserve battery power.

4. The apparatus of claim 1, wherein each slave controller is configured to test a different memory array or a different portion of the same memory array in serial.

5. The apparatus of claim 1, wherein the master controller is configured to control testing to reduce power-on or wake-up self-test time.

6. The apparatus of claim 1, wherein each slave controller is configured to control testing of a different memory array or a different portion of the same memory array and wherein the testing is configured to be done concurrently.

7. The apparatus of claim 6, wherein the different memory arrays or the different portions of the same memory array comprise at least one cache.

8. The apparatus of claim 1, wherein each slave controller is configured to test at least a portion of a memory array.

9. The apparatus of claim 1, wherein each slave controller is configured to test at least two memory arrays.

10. The apparatus of claim 9, wherein one of the memory arrays is a data cache and the other is a tag cache.

11. A method of conducting memory built-in self-test (MBIST) testing in a semiconductor device comprising:
   sending address and test data to a plurality of Memory Built-In Self-Test Data Path interfaces (MBISTDP I/Fs) from a master controller, wherein the MBISTDP I/Fs and the master controller are connected in a ring;
   forwarding the address and test data to at least a first slave controller and a second slave controller from at least one of the MBISTDP I/Fs;
   conducting a first MBIST test on a first memory array attached to the first slave controller;
   conducting a second MBIST test on a second memory array attached to the second slave controller;
   returning first test result data from the first slave controller to a first MBISTDP I/F in the ring;
   returning second test result data from the second slave controller to a second MBISTDP I/F in the ring;
   forwarding the first test result data from the first MBISTDP I/F to the second MBISTDP I/F;
   concatenating, at the second MBISTDP I/F, the first test result data and the second test result data to generate concatenated test result data; and
   forwarding the concatenated test result data to a third MBISTDP I/F in the ring.

12. The method of claim 11 wherein the first and second MBIST tests are conducted concurrently and wherein sending the address and, test data includes the master controller sending a command to the first and second slave controllers requesting that the first and second MBIST tests be conducted concurrently.

13. The method of claim 11 wherein the first and second MBIST tests are conducted in series and wherein sending the address and test data includes the master controller sending one or more commands to the first and second slave controllers requesting that the first and second MBIST tests be conducted in series.

14. The method of claim 11 wherein one of the first and second memory arrays is a data cache and the other is a tag cache.

15. A non-transitory computer-readable storage device encoded with data that, when implemented in a manufacturing facility, adapts the manufacturing facility to create an apparatus that, when operated, performs a process comprising:
   sending address and test data to a plurality of Memory Built-In Self-Test Data Path interfaces (MBISTDP I/Fs) from a master controller, wherein the MBISTDP I/Fs and the master controller are connected in a ring;
   forwarding the address and test data to at least a first slave controller and a second slave controller from at least one of the MBISTDP I/Fs;
   conducting a first MBIST test on a first memory array attached to the first slave controller;
   conducting a second MBIST test on a second memory array attached to the second slave controller;
   returning first test result data from the first slave controller to a first MBISTDP IF in the ring;
   returning second test result data from the second slave controller to a second MBISTDP I/F in the ring;
   forwarding the first test result data from the first MBISTDP I/F to the second MBIST DP I/F;
   concatenating, at the second MBISTDP I/F, the first test result data and the second test result data to generate concatenated test result data; and
   forwarding the concatenated test result data to a third MBISTDP I/F in the ring.

16. The non-transitory computer-readable storage device of claim 15 wherein the first and second MBIST tests are conducted concurrently and wherein sending the address and test data includes the master controller sending a command to the first and second slave controllers requesting that the first and second MBIST tests be conducted concurrently.

17. The non-transitory computer-readable storage device of claim 15 wherein the first and second MBIST tests are conducted in series and wherein sending the address and test data includes the master controller sending one or more commands to the first and second slave controllers requesting that the first and second MBIST tests be conducted in series.

18. The non-transitory computer-readable storage device of claim 15 wherein one of the first and second memory arrays is a data cache and the other is a tag cache.

* * * * *